(12) United States Patent  (10) Patent No.: US 8,905,765 B2
Yeh  (45) Date of Patent: Dec. 9, 2014

(54) SELF LOADING ELECTRICAL CONNECTOR AND THE ASSEMBING METHOD THEREOF

(71) Applicant: Hon Hai Precision Industry Co., Ltd., New Taipei (TW)

(72) Inventor: Cheng-Chi Yeh, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 73 days.

(21) Appl. No.: 13/845,131

(22) Filed: Mar. 18, 2013

(65) Prior Publication Data

US 2014/0134880 A1    May 15, 2014

(30) Foreign Application Priority Data

Nov. 14, 2012   (TW) .............................. 101142347 A (51) Int. Cl.
*H01R 12/00* (2006.01)
*H05K 7/00* (2006.01)

(52) U.S. Cl.
CPC . *H05K 7/00* (2013.01); *Y10S 439/94* (2013.01)
USPC ................ 439/73; 439/331; 439/940; 439/41

(58) Field of Classification Search
USPC ...................................... 439/73, 331, 940, 41
See application file for complete search history.

(56) References Cited

U.S. PATENT DOCUMENTS

| | | | |
|---|---|---|---|
| 7,001,197 B2 | 2/2006 | Shirai et al. | |
| 7,794,261 B2* | 9/2010 | Terhune et al. | 439/331 |
| 7,798,818 B2* | 9/2010 | Yeh et al. | 439/71 |
| 7,828,565 B2* | 11/2010 | Ma et al. | 439/135 |
| 7,828,577 B2* | 11/2010 | Yeh | 439/331 |
| 7,841,883 B2* | 11/2010 | Yeh | 439/330 |
| 7,867,006 B2* | 1/2011 | Yeh | 439/331 |
| 7,878,836 B2* | 2/2011 | Lin et al. | 439/331 |
| 7,883,345 B2* | 2/2011 | Yeh et al. | 439/135 |
| 8,439,693 B2* | 5/2013 | Yeh et al. | 439/135 |
| 8,500,477 B2* | 8/2013 | Yeh | 439/342 |
| 2007/0238327 A1* | 10/2007 | Hsu | 439/70 |
| 2008/0160814 A1* | 7/2008 | Howell | 439/331 |
| 2009/0104796 A1* | 4/2009 | Yeh | 439/73 |
| 2009/0246989 A1* | 10/2009 | Ma et al. | 439/135 |
| 2009/0280666 A1* | 11/2009 | Yeh | 439/246 |
| 2009/0311901 A1* | 12/2009 | Yeh | 439/331 |
| 2009/0325403 A1* | 12/2009 | Yeh | 439/73 |
| 2010/0029107 A1* | 2/2010 | Yeh et al. | 439/135 |
| 2010/0035458 A1* | 2/2010 | Yeh et al. | 439/345 |
| 2010/0055946 A1* | 3/2010 | Yeh | 439/83 |
| 2010/0055957 A1* | 3/2010 | Yeh | 439/331 |
| 2010/0055958 A1* | 3/2010 | Lin et al. | 439/331 |
| 2010/0055959 A1* | 3/2010 | Yeh et al. | 439/331 |
| 2010/0087085 A1* | 4/2010 | Liu et al. | 439/353 |
| 2010/0093201 A1* | 4/2010 | Yeh | 439/330 |
| 2010/0099294 A1* | 4/2010 | Yeh | 439/366 |
| 2010/0120268 A1* | 5/2010 | Yeh | 439/68 |
| 2010/0130049 A1* | 5/2010 | Yeh et al. | 439/331 |

(Continued)

*Primary Examiner* — Ross Gushi
(74) *Attorney, Agent, or Firm* — Wei Te Chung; Ming Chieh Chang (57) ABSTRACT

An electrical connector for use with an electronic package, includes a base having two posts. A plurality of contacts is received in the base. A carrier defines a center opening to receive the electronic package and two holes corresponding to the posts. The holes of the carrier cooperate with the posts of the base to guide the carrier loading the electronic package mount to the base.

20 Claims, 9 Drawing Sheets

(56) References Cited

U.S. PATENT DOCUMENTS

| | | | |
|---|---|---|---|
| 2011/0039425 A1* | 2/2011 | Hsu et al. | 439/73 |
| 2011/0097921 A1* | 4/2011 | Hsu et al. | 439/331 |
| 2011/0177709 A1* | 7/2011 | Yeh | 439/342 |
| 2012/0108096 A1* | 5/2012 | Yeh | 439/345 |
| 2012/0142209 A1* | 6/2012 | Yeh et al. | 439/345 |
| 2012/0156919 A1* | 6/2012 | Yeh et al. | 439/370 |
| 2012/0196469 A1* | 8/2012 | Yeh | 439/345 |
| 2012/0289075 A1* | 11/2012 | Yeh | 439/345 |
| 2013/0078827 A1* | 3/2013 | Yeh et al. | 439/76.1 |
| 2013/0342997 A1* | 12/2013 | Yeh | 361/704 |
| 2013/0344713 A1* | 12/2013 | Yeh | 439/68 |
| 2014/0011376 A1* | 1/2014 | Yeh | 439/68 |
| 2014/0011377 A1* | 1/2014 | Yeh | 439/73 |
| 2014/0057470 A1* | 2/2014 | Yeh | 439/159 |
| 2014/0099816 A1* | 4/2014 | Hsieh | 439/331 |
| 2014/0106605 A1* | 4/2014 | Yeh | 439/487 |
| 2014/0134880 A1* | 5/2014 | Yeh | 439/620.15 |

\* cited by examiner

SELF LOADING ELECTRICAL CONNECTOR AND THE ASSEMBING METHOD THEREOF

BACKGROUND OF THE INVENTION

1. Field of the Invention

The present invention relates to a electrical connector, and more particularly to the electrical connector having posts to guide a carrier loading an electronic package mounted thereto to prevent contacts of the electrical connector from damaging.

2. Description of Related Art

Competition and market demands have continued the trends toward faster, higher performance electrical systems, particularly with regard to computer systems. Along with the development of surface mount technology in the design of printed circuit boards, higher density electrical circuits, including higher density interconnect components have been developed to meet the increasing demand for higher performance electrical systems.

As is well understood in the art, surface mountable packaging allows for the connection of the package to pads on the surface of the circuit board rather than by contacts or pins soldered in plated holes going through the circuit board. As used herein, the term "package" shall refer to a chip carrying module that is to be mounted to a circuit board. Surface mount technology allows for an increased component density on a circuit board, thereby saving space on the circuit board.

Area array socket connectors have evolved, along with surface mount technology, as one high density interconnect methodology. One significant application of this technology, for example, is the land grid array (LGA) socket connector that is used with an LGA package. One major advantage of the LGA package lies in its durability. The LGA package is not easily damaged during the installation or removal process or by handling generally. At least some of the other IC packages, such as a pin grid array (PGA) package, have a standardized layout, or form factor, for contact leads or pins on the package. These contact leads are somewhat fragile and can be damaged if not handled properly. By contrast, with an LGA package, there is nothing protruding from the package that can get bent or otherwise damaged during normal handling. The LGA typically could only have some foreign material come in contact with the land or contact area. The land, however, could be scratched if the package was subjected to abuse.

While the LGA package is quite durable, the LGA socket is somewhat less so. In at least some LGA sockets, when the socket is opened, the electrical contacts, referred to as contact beams, are exposed and the LGA package is loaded directly on top of the contact beams. The LGA socket is designed for loading and unloading of the package in a vertical direction, e.g. normal to the circuit board, which requires that a socket cover or load plate and any other actuation components have at least a ninety degree range of movement so that they can be clear of a load path for the package. This exposes the flexible surface mount contact beams, rendering the beams susceptible to damage during loading and unloading of the package. The beams may be broken, bent, or otherwise deformed which results in misalignment of the beams with respect to the package.

Thus, a need exists for an LGA socket that reduces the susceptibility of the LGA surface mount contacts to damage.

SUMMARY OF THE INVENTION

An object of the present invention is to provide an electrical connector having guiding posts to guide an electronic package mounted thereto to prevent contacts of the electrical connector from damaging.

According to one aspect of the present invention, an electrical connector for use with an electronic package, comprises a base having two posts. A plurality of contacts is received in the base. A carrier defines a center opening to receive the electronic package and two holes corresponding to the posts. The holes of the carrier cooperate with the posts of the base to guide the carrier loading the electronic package mount to the base.

According to another aspect of the present invention, a method of assembling an electrical connector with an electronic package mounted to a printed circuit board, comprises: providing an insulative housing and a pick-up cap assembled with the insulative housing. Providing a fastening device includes a base and a cover, and further providing posts assemble to the base, and then assemble the fastening device and the posts around the insulative housing. Providing a carrier loads the electronic package and then assemble to the posts and located upon the pick-up cap. Then, draw the pick-up cap out of the insulative housing before close the cover and lock the cover and the base together.

Other objects, advantages and novel features of the invention will become more apparent from the following detailed description of a preferred embodiment when taken in conjunction with the accompanying drawings.

DETAILED DESCRIPTION OF THE INVENTION

Figure 1:
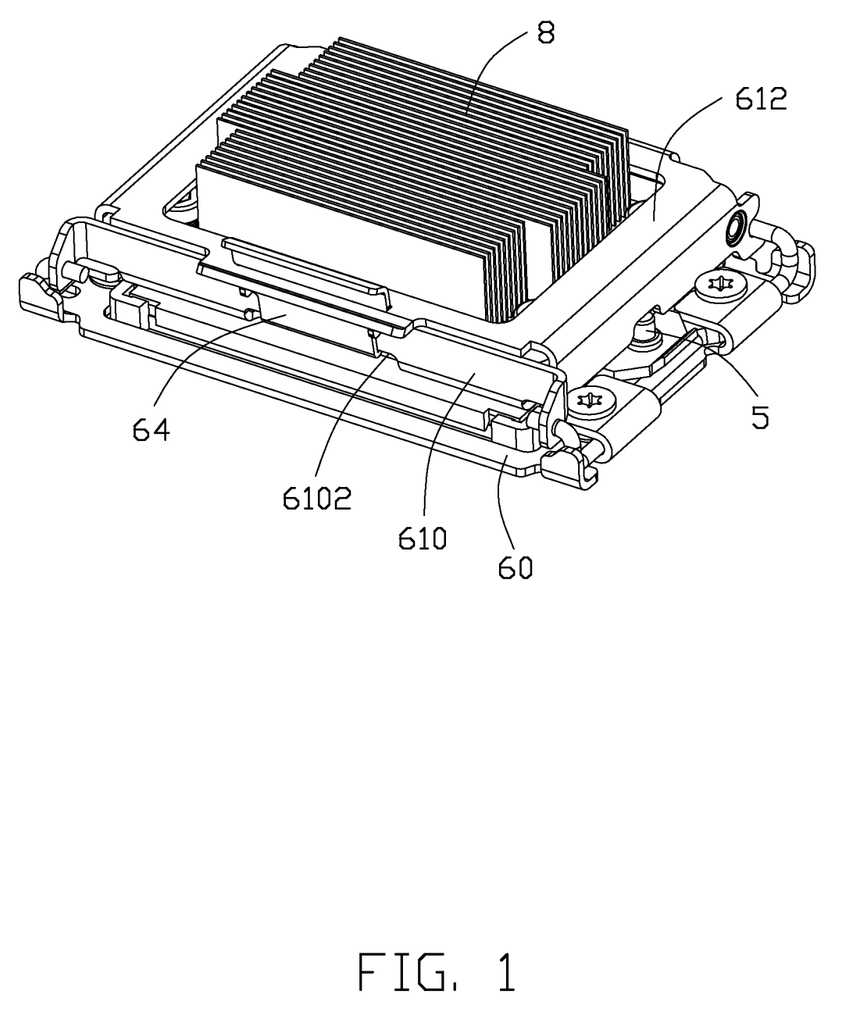
FIG. 1 is an assembled, perspective view of an electrical connector in accordance with the present invention, and a heat dissipating device is assembled to the electrical connector.
Figure 5:
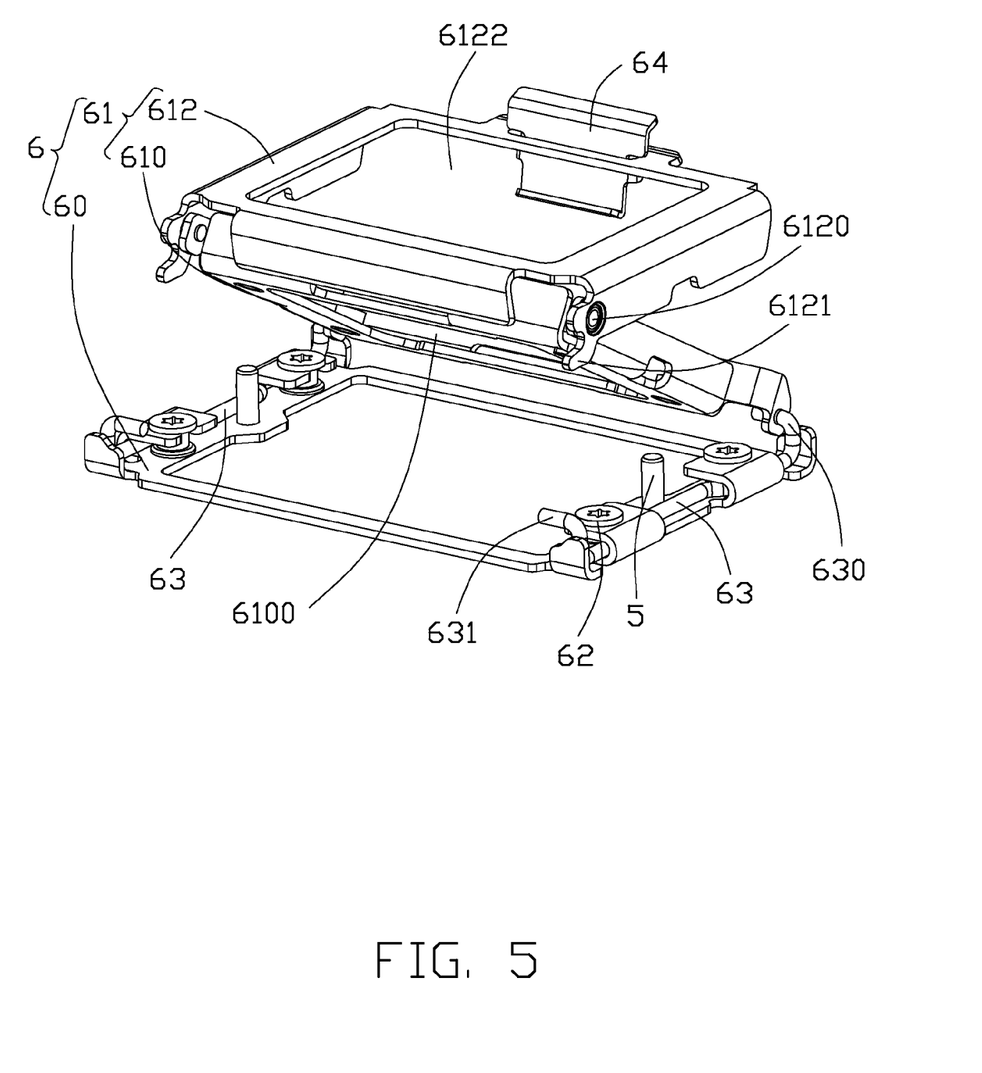
FIG. 5 is a perspective view of a fastening device shown in FIG. 2 with posts inserted into the fastening device.

Referring to FIGS. 1 and 5, an electrical connector used to electrically connect a electronic package 7 to a printed circuit board (not shown), comprises a base, a pick-up cap 3, and a carrier 4. The base comprises an insulative housing 4, a fastening device 6, and a pair of posts or a first alignment device 5 assembled to the fastening device 6.

Figure 2:
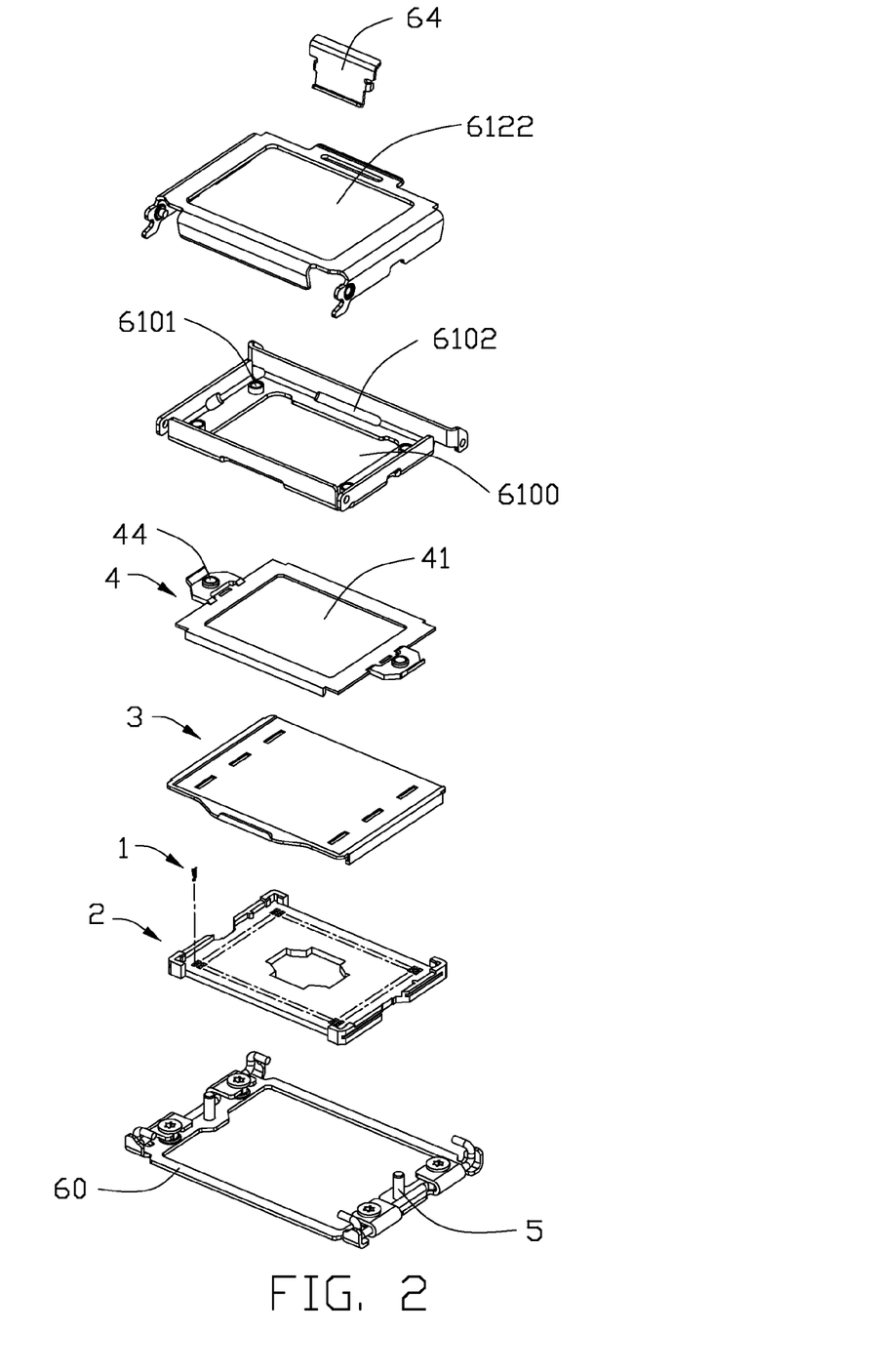
FIG. 2 is an exploded perspective view of the electrical connector.
Figure 3:
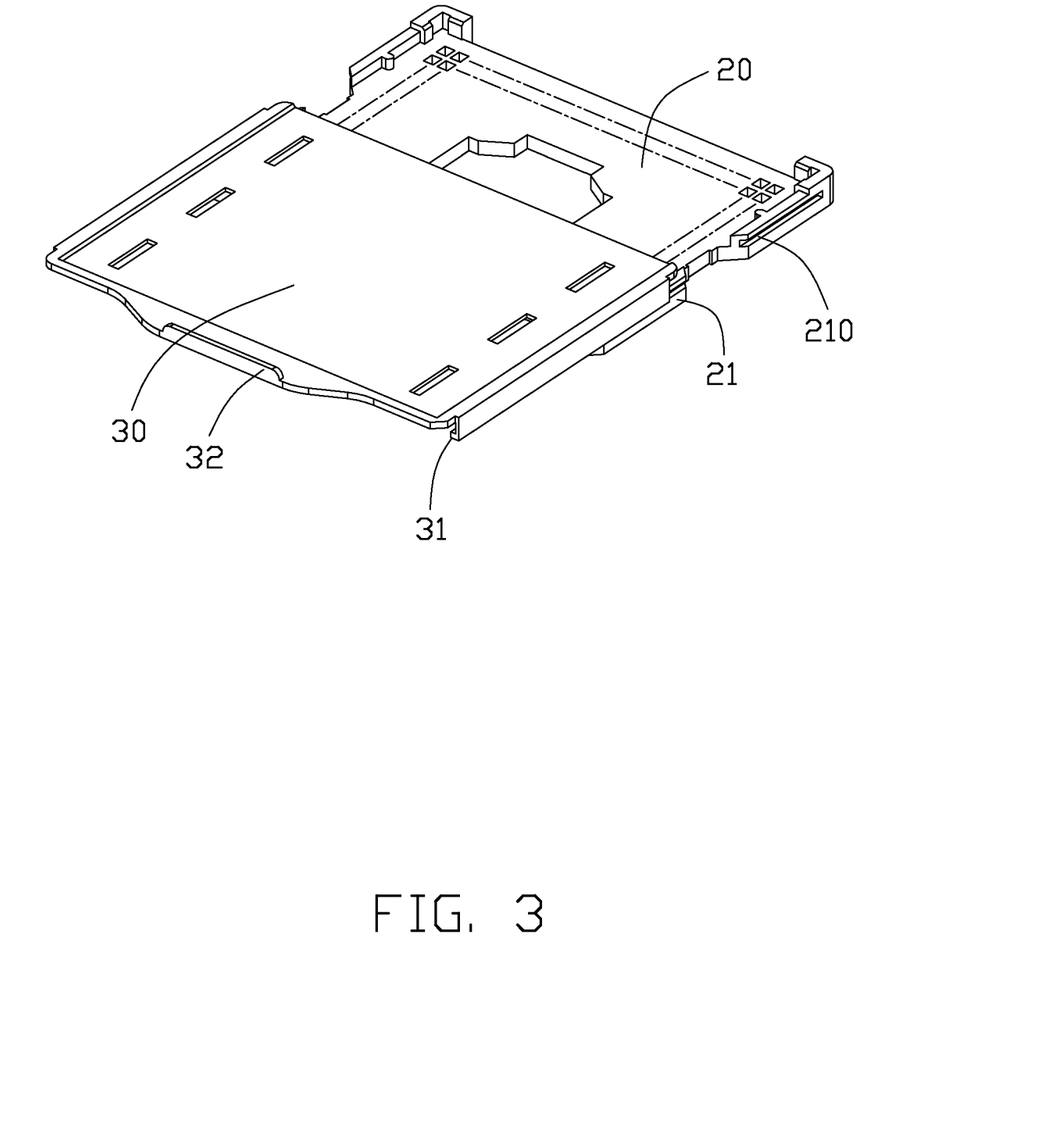
FIG. 3 is an assembled view of an insulative housing with a pick-up cap of the electrical connector shown in FIG. 2.

Referring to FIGS. 2 and 3, the insulative housing 2 has a plurality of contacts 1 (only shown one and omitted others) to be received in a cavity 20 formed by at least a pair of opposite sidewalls 21. The sidewalls 21 have a pair of channels 210 to receive guide rails 31 formed on the pick-up cap 3. The pick-up cap 3 includes a main body 30 covered upon the cavity 20 for preventing the contacts 1 from damaging and polluting. The guide rails 31 are disposed at two opposite sides of the main body 30 to couple to the channels 210 of the insulative housing 2 for guiding the pick-up cap 3 to laterally move respective to the insulative housing 2. The main body 30 of the pick-up cap 3 further has a tongue 32 located perpendicular to a direction, which is defined by an extension direction of the guide rails 31. When the pick-up cap 3 mounts on and coves the insulative housing 2, the tongue 32 extends beyond the edge of the insulative housing 2 for providing a holding position by an operator drawing.

Figure 4:
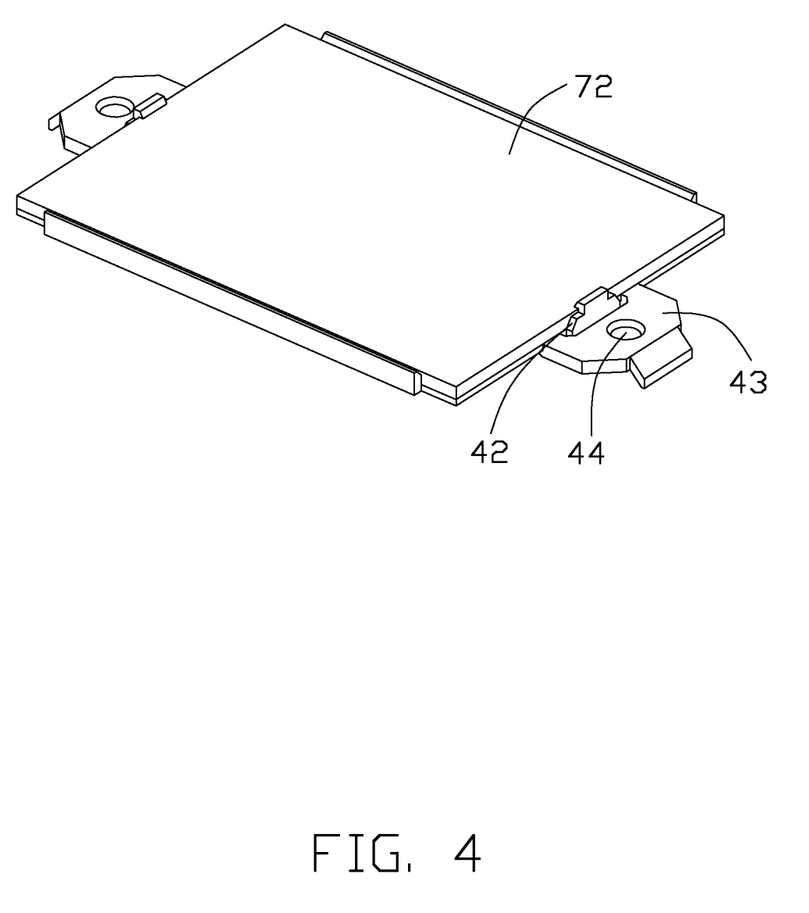
FIG. 4 is an assembled view of a carrier shown in FIG. 2 with an electronic package.
Figure 6:
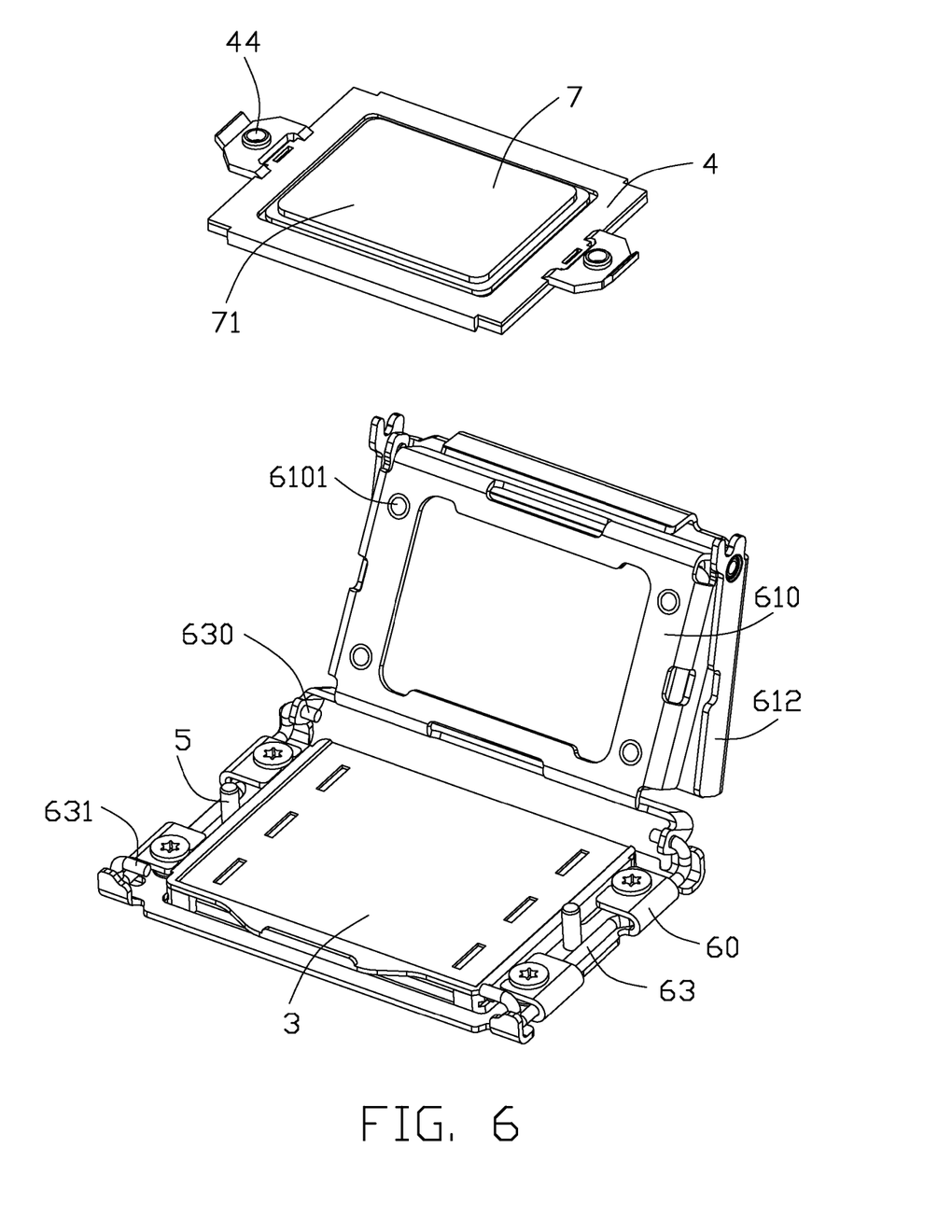
FIG. 6 is a perspective view of the carrier with the electronic package assembled into the electrical connector.

Referring to FIGS. 2, 4 and 6, the carrier 4 defines a center opening 41 to allow a die 71 located at a top position of the electronic package 7 to pass thereof A pair of hooks 42 of the carrier 4 are designed to latch a substrate 72 located at a bottom position of the electronic package 7 such that the electronic package 7 can be moved with the carrier 4 in common. A pair of ears 43 are disposed at two opposite ends of carrier 4 and each has a hole or a second alignment device 44 therein.

Referring to FIGS. 2 and 5, the fastening device 6 includes a base 60 and a cover 61. The base 60 is configured with a frame structure and attached to the printed circuit board by a plurality of screws 62 at two opposite ends. Two levers 63 are assembled to the two opposite ends of base 60, and each lever 63 has a first end 630 to assemble the cover 61 and a second end 631 to lock the cover 61. The pair of posts 5 are assembled at the two opposite ends of the base 60, respectively. In the perfect embodiment of the prevent invention, the cover 61 includes a loading plate 610 and cover plate 612. One end of the loading plate 610 is pivotally mounted to the first ends 630 of the levers 63, and the other end of the loading plate 610 is pivotally mounted to one end called pivotal end 6120 of the cover plate 612. The pivotal end 6120 has a pair of catchers 6121 to latch the second ends 631 of the levers 63. A heat sink 8 is secured to the loading plate 610 by a plurality of screws 6101. The loading plate 610 and the cover plate 612 each defines a through hole 6100, 6122 therein such that the heat sink 8 can transfer heat generated by the electronic package 7. The cover plate 612 has a clasp 64 located opposite the pivotal end 6120 and the loading plate 610 defines a recess 6102 for latching with the clasp 64 such that the cover plate 612 locks with the loading plate 610.

Figure 7:
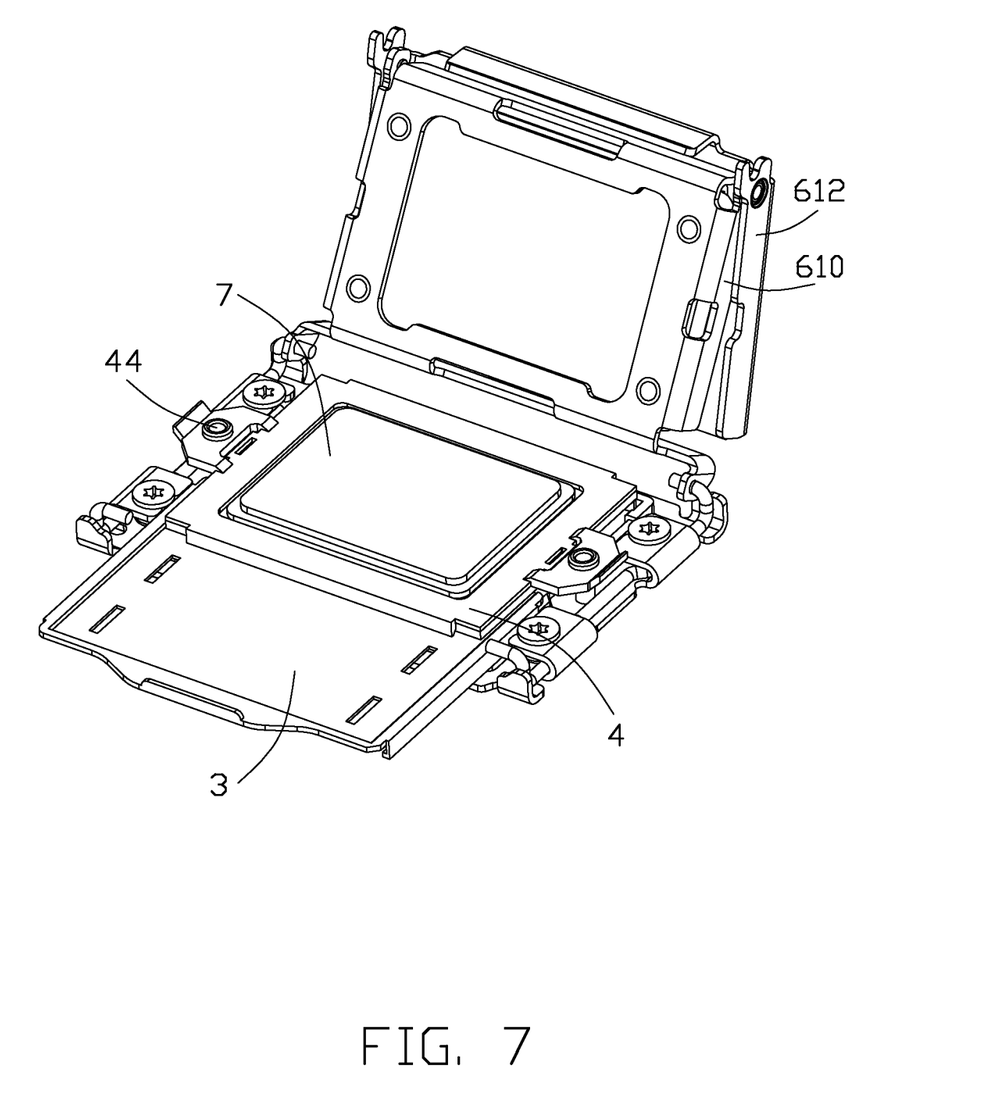
FIG. 7 is a perspective view of the pick-up cap removed from the electrical connector, and the electronic package is assembled to the electrical connector.
Figure 8:
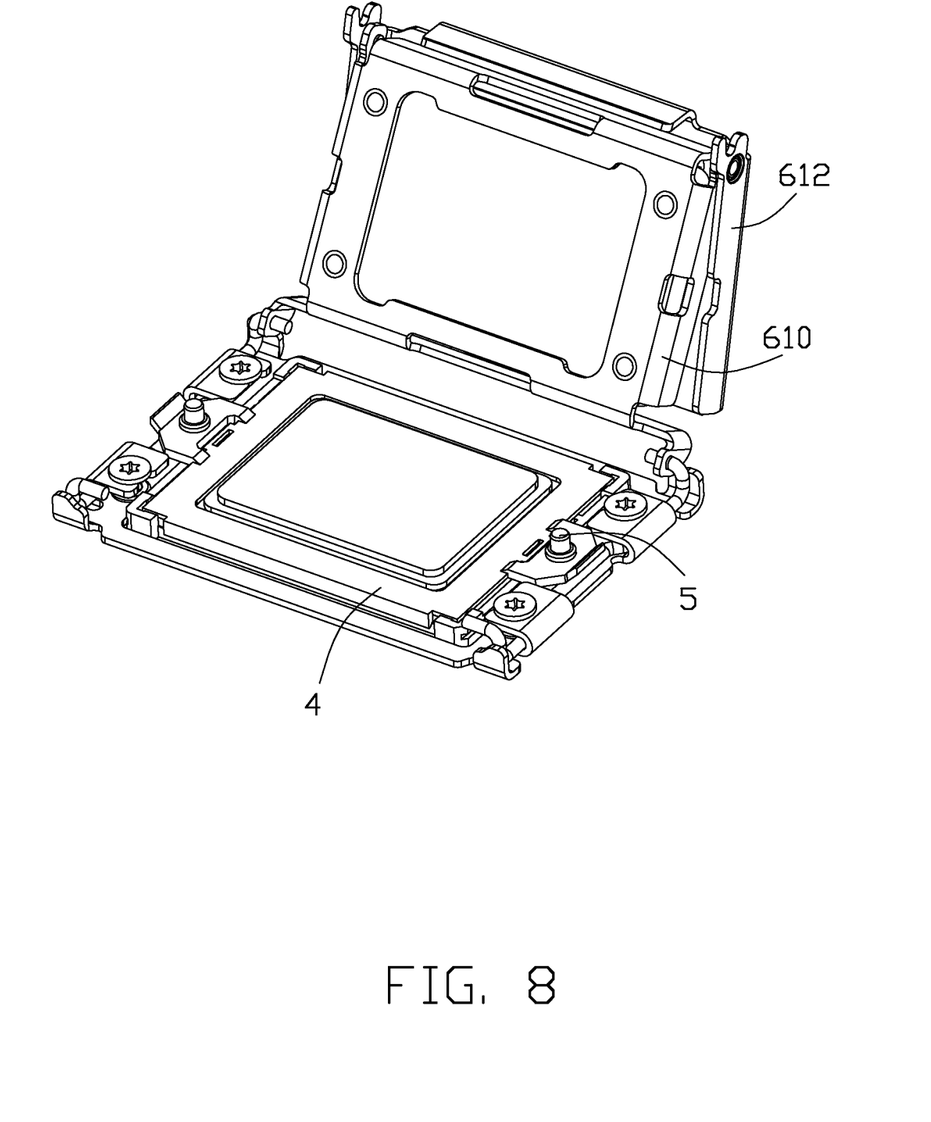
FIG. 8 is similar with FIG. 7, but the pick-up cap is removed.
Figure 9:
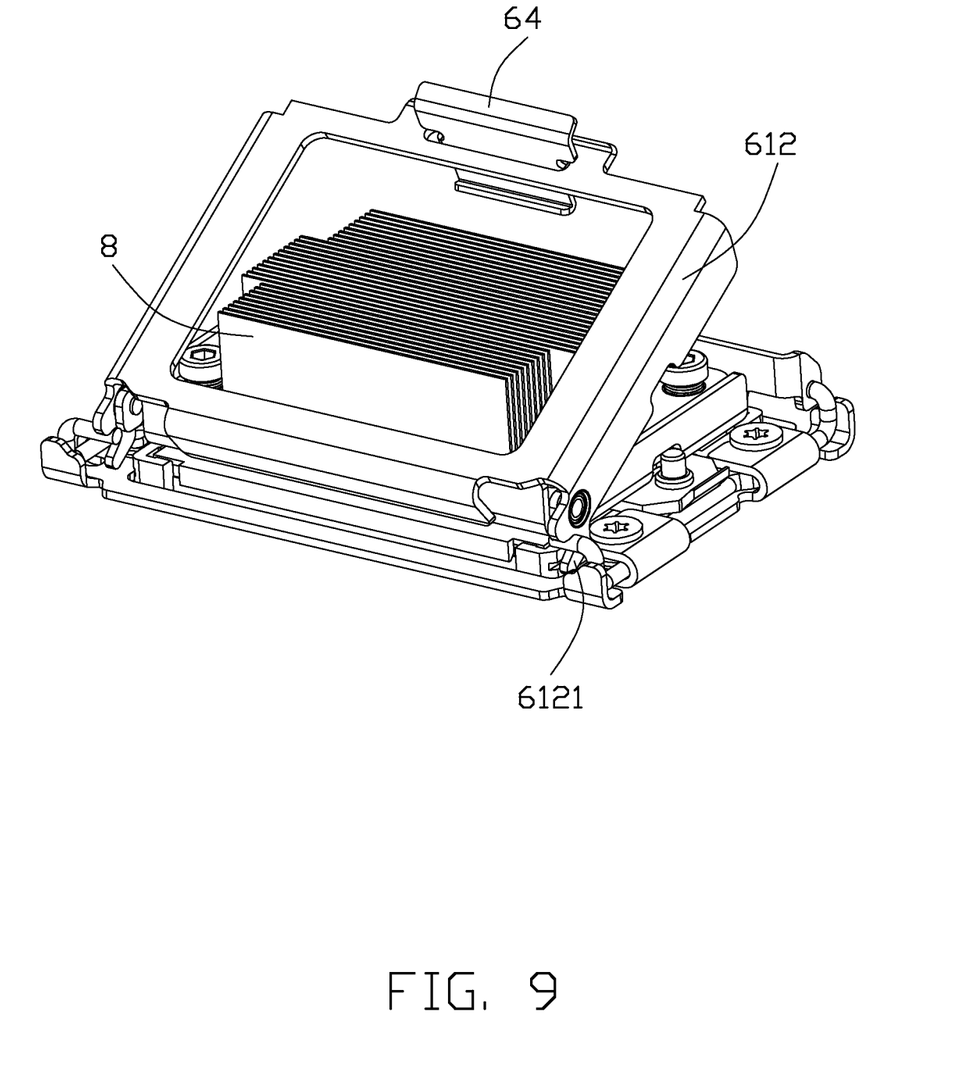
FIG. 9 is assembled, perspective view of the electrical connector, showing one end of the cover plate being latched.

The assembling method of the electrical connector for connecting the electronic package 7 and the printed circuit board comprises steps as follows: (1). Referring to FIG. 3, mount the insulative housing 2 assembled with the pick-up cap 3 on the printed circuit board. (2). Assemble the fastening device 6 and the posts 5 together, and then mount the fastening device 6 and the posts 5 to the printed circuit board and around the insulative housing 2. (3). Referring to FIG. 6, open the cover 61 with regard to the base 60, and then assemble the carrier 4 loading the electronic package 7 upon the pick-up cap 3 by the posts 5 of the fastening device 6 guiding the holes 44 of the carrier 4. (4). Referring to FIGS. 7 and 8, latterly draw the pick-up cap 3 out of the insulative housing 2 and then the carrier 4 loading the electronic package 7 naturally downward move due to gravity along the posts 5 for contacting the contacts 1 of the insulative housing 2. (5). Referring to FIGS. 9 and 1, close the cover 61, in that condition the catchers 6121 of the cover plate 612 latch the second ends 631 of the levers 63 and the clasp 64 of the cover plate 612 latch the recess 6102 of the loading plate 610. After the above steps, the electronic package 7 mounted in the electrical connector can electrically connect with the printed circuit board. In addition, the step (1) and the step (2) can change orders each other in the above assembling steps.

The key structure of the prevent invention is the carrier 4 loading the electronic package 7 mounted upon the insulative housing 2 guiding by the posts 5, so another alternative assembling method is provided. In the another assembling method, the pick-up cap 3 is removed from the insulative housing 2 before the carrier 4 is assembled upon the insulative housing 2, thereby in this process, the pick-up cap 3 and the carrier 4 do not has a common stage mounted upon the insulative housing 2.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for use with an electronic package, comprising:
a base equipped with one first alignment device;
a plurality of contacts disposed in the base; and
a carrier defined a center opening to receive the electronic package and equipped with one second alignment corresponding to the first alignment device; wherein
the second alignment device of the carrier cooperates with the first alignment device of the base to guide the carrier to be assembled to the base and synchronically load the electronic package into the base under condition that said carrier is constantly associated with the base during operation.

2. The electrical connector as claimed in claim 1, further comprising a pick-up cap assembled on the base.

3. The electrical connector as claimed in claim 2, wherein during the carrier mounted on the base, the pick-up cap locates on the base, and after the carrier mounted on the base, the pick-up cap need remove from the base.

4. The electrical connector as claimed in claim 3, wherein the pick-up cap has a main body located below the opening of the carrier and removes from the base by lateral drawing.

5. The electrical connector as claimed in claim 2, wherein the base includes an insulative housing and a fastening device having the first alignment device thereon.

6. The electrical connector as claimed in claim 5, wherein the insulative housing has a pair of sidewalls defined channels respectively, and the main body of pick-up cap has a pair of guide rails received in the channels for moving with regard to the insulative housing.

7. The electrical connector as claimed in claim 5, wherein the fastening device includes a base mounted surround the insulative housing, two levers mounted on the base, and a cover pivotally mounted to the two levers.

8. The electrical connector as claimed in claim 1, wherein said first alignment device is a post, and said second alignment device is a through hole.

9. The electrical connector as claimed in claim 1, wherein the base includes an insulative housing and a metallic fastening device surrounding said housing, and said fastening device includes a pair of fixed levers each defines a front end and a rear end under condition that the front ends of said pair of fixed levers commonly define a front shaft to lock a cover plate, and the rear ends of said pair of fixed levers commonly define a rear shaft to lock a loading plate which is pivotally mounted to said cover plate.

10. A method of assembling an electrical connector with an electronic package mounted to a printed circuit board, comprising:
providing an insulative housing and a pick-up cap assembled with the insulative housing;
providing a fastening device including a base and a cover'
assembling the fastening device around the insulative housing;
providing a carrier loading the electronic package;

assembling the carrier with the associated electronic package upon the pick-up cap;

removing the pick-up cap from the insulative housing; and closed the cover and locking the cover and the base together.

11. The method of assembling the electrical connector as claimed in claim 10, wherein said carrier and said fastening device are equipped with alignment devices to assure correct loading of said electronic package to the housing.

12. The method of assembling the electrical connector as claimed in claim 11, wherein said alignment devices include a post and a through hole.

13. The method of assembly the electrical connector as claimed in claim 12, wherein said post is formed on the fastening device, and said through hole is formed in the carrier.

14. The method of assembling the electrical connector as claimed in claim 10, wherein the insulative housing has a pair of sidewalls defined channels respectively, and the pick-up cap has a pair of guide rails received in the channels for moving with regard to the insulative housing.

15. The method of assembling the electrical connector as claimed in claim 10, wherein the carrier has a center opening to receive the electronic package and two holes to mount to the posts.

16. The method of assembling an electrical connector as claimed in claim 10, wherein said pick-up cap is removed from the housing via a transverse direction.

17. An electrical connector comprising:

an insulative housing associated with a detachable pick-up cap thereon;

a plurality of contacts disposed in the housing;

a fastening device including a base plate surrounding the housing, and a subassembly including mutually pivotally arranged loading plate and cover plate, pivotally mounted to said base plate; and a carrier associated with an electronic package on an underside, assembled to the fastening device to have the electronic package delicately positioned upon the associated housing and pick-up cap; wherein the fastening device is configured to allow the pick-up cap to be removed from the housing after the carrier has been delicately positioned upon the associated housing and pick-up cap, so as to have the corresponding electronic package downwardly dropped to directly confront the contacts in the housing.

18. The electrical connector as claimed in claim 17, wherein said fastening device is configured to allow said pick-up cap to leave from the housing in a transverse direction.

19. The electrical connector as claimed in claim 17, wherein said housing is configured to allow the pick-up cap to be withdrawn therefrom in a transverse direction.

20. The electrical connector as claimed in claim 17, further including alignment means applied upon the carrier and one of the fastening device and said housing.

* * * * *